(12) United States Patent
Kiuchi et al.

(10) Patent No.: US 12,068,697 B2
(45) Date of Patent: Aug. 20, 2024

(54) ELECTRIC CONDUCTIVE PART FOR POWER CONVERSION CIRCUIT

(71) Applicant: DENSO CORPORATION, Kariya (JP)

(72) Inventors: Yuuya Kiuchi, Kariya (JP); Kenshiro Hida, Kariya (JP)

(73) Assignee: DENSO CORPORATION, Kariya (JP)

( * ) Notice: Subject to any disclaimer, the term of this patent is extended or adjusted under 35 U.S.C. 154(b) by 384 days.

(21) Appl. No.: 17/669,563

(22) Filed: Feb. 11, 2022

(65) Prior Publication Data

US 2022/0166311 A1 May 26, 2022

Related U.S. Application Data

(63) Continuation of application No. PCT/JP2020/028812, filed on Jul. 28, 2020.

(30) Foreign Application Priority Data

Aug. 27, 2019 (JP) .................. 2019-154982

(51) Int. Cl.
*H02M 3/00* (2006.01)
*H02M 7/00* (2006.01)
(Continued)

(52) U.S. Cl.
CPC ........... *H02M 7/003* (2013.01); *H02M 3/003* (2021.05); *H05K 5/0217* (2013.01); *H02M 3/158* (2013.01);
(Continued)

(58) Field of Classification Search
CPC .... H02M 3/003; H02M 7/003; H05K 7/1432; H05K 7/14329; H05K 7/20854; H05K 7/2089; H05K 7/209
See application file for complete search history.

(56) References Cited

U.S. PATENT DOCUMENTS

2014/0116751 A1 5/2014 Hatori
2015/0231975 A1* 8/2015 Ishii ..................... B60L 50/13
307/10.1
(Continued)

FOREIGN PATENT DOCUMENTS

CN 105188318 A 12/2015
JP 2011-114872 A 6/2011
(Continued)

OTHER PUBLICATIONS

Translation of the International Searching Authority written opinion in PCT/JP2020/028812, mail date Sep. 1, 2020. (Year: 2020).*

*Primary Examiner* — Fred E Finch, III
(74) *Attorney, Agent, or Firm* — Oliff PLC

(57) ABSTRACT

An electric conductive part for a power conversion circuit includes a connection conductive portion and a branch portion. The connection conductive portion is configured to connect a joint portion of a battery with a capacitor that is included in the power conversion circuit. The connection conductive portion includes a path portion, which is configured to connect the joint portion with the capacitor, and a branch portion that branches from the path portion. The branch portion extends toward a control circuit board and is connected with the control circuit board. The control circuit board is configured to control drive of a switch element of the power conversion circuit.

10 Claims, 7 Drawing Sheets

(51) Int. Cl.
*H05K 5/02* (2006.01)
*H02M 3/158* (2006.01)
*H02M 7/5387* (2007.01)
*H02P 27/08* (2006.01)

(52) U.S. Cl.
CPC ......... *H02M 7/53871* (2013.01); *H02P 27/08* (2013.01)

(56) References Cited

U.S. PATENT DOCUMENTS

2020/0195189 A1* 6/2020 Kitamura ................ B60L 50/51
2023/0253891 A1* 8/2023 Mühlfeld .............. H02M 1/088
363/123

FOREIGN PATENT DOCUMENTS

| JP | 2011-125179 A | 6/2011 |
| JP | 2013-069737 A | 4/2013 |
| JP | 2014-090115 A | 5/2014 |
| JP | 6465017 B2 | 2/2019 |
| WO | 2021/039238 A1 | 3/2021 |

* cited by examiner

ELECTRIC CONDUCTIVE PART FOR POWER CONVERSION CIRCUIT

CROSS REFERENCE TO RELATED APPLICATION

The present application is a continuation application of International Patent Application No. PCT/JP2020/028812 filed on Jul. 28, 2020, which designated the U.S. and claims the benefit of priority from Japanese Patent Application No. 2019-154982 filed on Aug. 27, 2019. The entire disclosures of all of the above applications are incorporated herein by reference.

TECHNICAL FIELD

The present disclosure relates to an electric conductive part for a power conversion circuit.

BACKGROUND

Conventionally, a voltage converter circuit including a filter capacitor is known.

SUMMARY

According to an aspect of the present disclosure, an electric conductive part is for a power conversion circuit. The electric conductive part comprises a connection conductive portion configured to connect a joint portion of a battery with a capacitor that is included in the power conversion circuit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
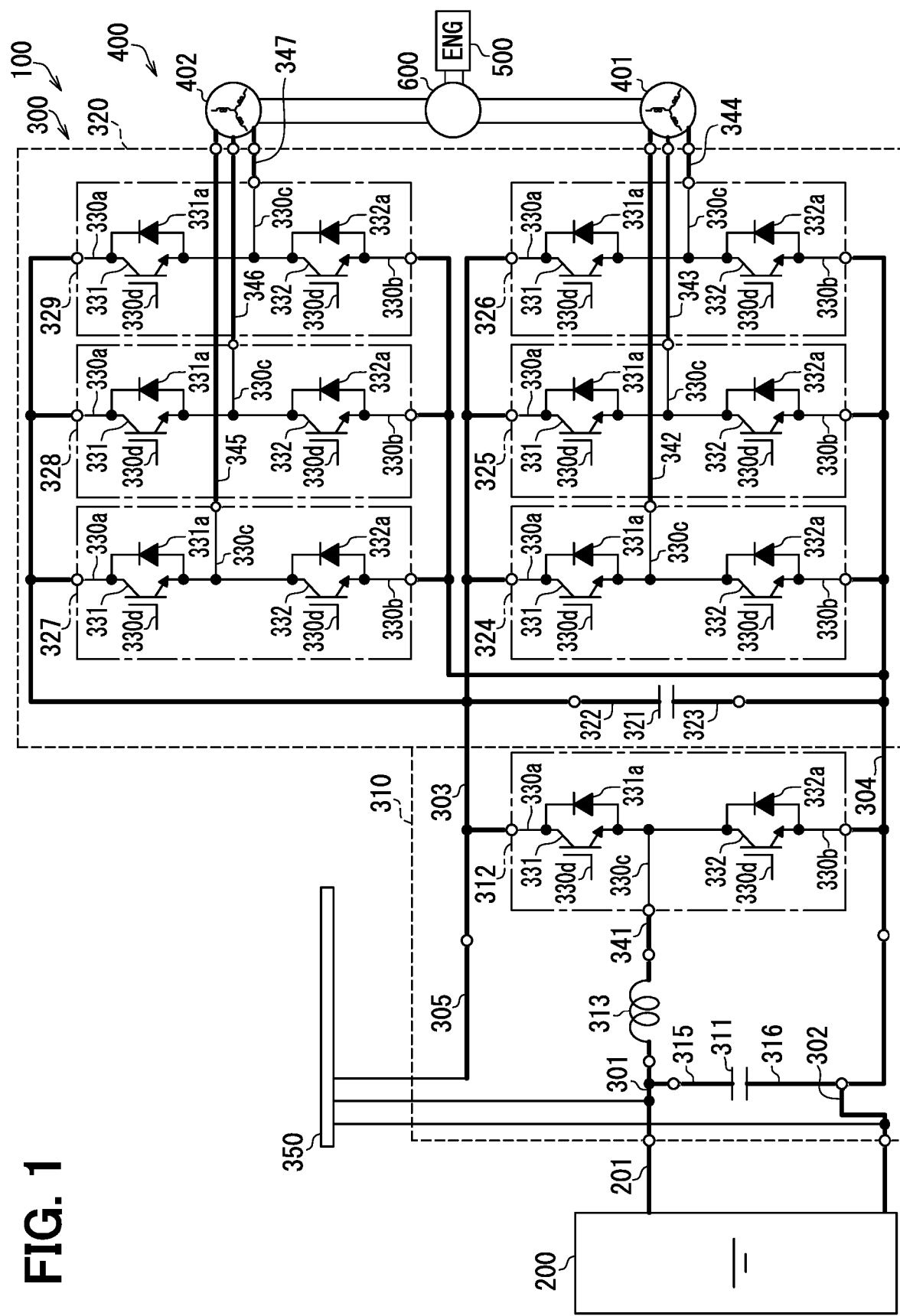
FIG. 1 is a circuit diagram illustrating an in-vehicle system.

Hereinafter, examples of the present disclosure will be described.

According to an example of the present disclosure, a voltage converter circuit includes a filter capacitor. The filter capacitor and a battery are electrically connected with each other via a bus bar.

In this configuration, a current between the battery and the filter capacitor flows through the bus bar. This electric conduction causes the bus bar to generate heat. Therefore, a concern arises that the filter capacitor connected to this bus may rise in temperature, and its electric characteristics may change.

According to an example of the present disclosure, an electric conductive part is for a power conversion circuit. The electric conductive part comprises a connection conductive portion configured to connect a joint portion of a battery with a capacitor that is included in the power conversion circuit. The connection conductive portion includes a path portion configured to connect the joint portion with the capacitor and a branch portion that branches from the path portion. The branch portion extends toward a control circuit board and is connected with the control circuit board. The control circuit board is configured to control drive of a switch element of the power conversion circuit.

According to this configuration, heat generated in the connection conductive portion due to the electric conduction between the battery and the capacitor is thermally conducted to the control circuit board via the branch portion. This configuration enables to suppress temperature rise in the connection conductive portion. In addition, temperature rise in the capacitor connected to the connection conductive portion is also suppressed. In addition, change in an electric characteristic of the capacitor due to the temperature rise is suppressed.

The following will describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each form, the other forms described above can be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

<In-Vehicle System>

First, an in-vehicle system 100 to which a bus bar module 700 is applied will be described with reference to FIG. 1. The in-vehicle system 100 constitutes a hybrid system.

The in-vehicle system 100 includes a battery 200, a power conversion device 300, and a motor 400. Further, the in-vehicle system 100 includes an engine 500 and a power distribution mechanism 600. The bus bar module 700 is included in the power conversion device 300. The motor 400 includes a first MG 401 and a second MG 402. MG is an abbreviation of a motor generator.

The in-vehicle system 100 further includes a plurality of electronic control units (ECUs). The ECUs transmit signals to and receive signals from each other via a bus wiring. The plurality of ECUs cooperates with each other to control the hybrid vehicle. By the coordinated control of the plurality of ECUs, electric driving and electric generation (regeneration) of the motor 400 according to an SOC of the battery 200, an output of the engine 500, and the like are controlled. The SOC is an abbreviation of state of charge. ECU is an abbreviation of electronic control unit.

The ECU includes at least one computation processing unit (also referred to as a CPU) and at least one memory device (also referred to as a MMR) as a storage medium storing a program and data. The ECU includes a microcontroller including a computer readable storage medium. The storage medium is a non-transitory tangible storage medium that non-temporally stores a computer readable program. The storage medium may include a semiconductor memory, a magnetic disk, or the like. Hereinafter, the components of the in-vehicle system 100 will be described individually.

The battery 200 includes a plurality of secondary batteries. The secondary batteries form a battery stack connected in series. As the secondary batteries, a lithium ion secondary battery, a nickel hydrogen secondary battery, an organic radical battery, or the like may be employed.

The secondary battery generates an electromotive voltage by chemical reaction. The secondary battery has a property that deterioration is accelerated when a charge amount is too large or too small. In other words, the secondary battery has a property that deterioration is accelerated when the SOC is overcharged or overdischarged.

The SOC of the battery 200 corresponds to a SOC of the battery stack described above. The SOC of the battery stack is the sum of the SOCs of the plurality of secondary batteries. Overcharging and overdischarging of the SOC of the battery stack is avoided by the above-mentioned cooperative control. On the other hand, overcharging and overdischarging of the SOCs of the plurality of secondary batteries are avoided by an equalization process for equalizing the SOCs of the plurality of secondary batteries.

The equalization process is performed by individually charging and discharging the plurality of secondary batteries. The battery 200 is provided with a monitoring unit including a switch for individually charging and discharging respective of the plurality of secondary batteries. Further, the battery 200 is provided with a current sensor, a temperature sensor, and the like for detecting the SOC of each of the plurality of secondary batteries. A battery ECU, which is one of the plurality of ECUs, controls opening and closing of the switch based on an output of these sensors and the like. In this way, the SOC of each of the plurality of secondary batteries is equalized. Voltage detection described later is also used for detection of the SOC.

The power conversion device 300 performs power conversion between the battery 200 and the first MG 401. The power conversion device 300 further performs power conversion between the battery 200 and the second MG 402. The power conversion device 300 converts a DC power of the battery 200 into an AC power at a voltage level suitable for electric driving of the first MG 401 and the second MG 402. The power conversion device 300 converts the AC power generated by power generation of the first MG 401 and the second MG 402 into a DC power at a voltage level suitable for charging the battery 200. The power conversion device 300 will be described in detail later.

The first MG 401, the second MG 402, and the engine 500 are each connected to the power distribution mechanism 600. The first MG 401 generates electricity by a rotational energy supplied from the engine 500. The AC power generated by this power generation is converted into a DC power and is stepped down by the power conversion device 300. This DC power is supplied to the battery 200. The DC power is also supplied to various electric loads mounted on the electric vehicle.

The second MG 402 is connected to an output shaft of the hybrid vehicle. A rotational energy of the second MG 402 is transmitted to traveling wheels via the output shaft. On the contrary, rotational energy of the traveling wheel is transmitted to the second MG 402 via the output shaft.

The second MG 402 is electrically driven by an AC power supplied from the power conversion device 300. The rotational energy generated by this electric driving is distributed to the engine 500 and the traveling wheels by the power distribution mechanism 600. In this way, cranking of the crankshaft is performed, and a propulsive force is applied to the traveling wheels. Further, the second MG 402 is regenerated by a rotational energy transmitted from the traveling wheel. An AC power generated by this regeneration is converted into a DC power and is stepped down by the power conversion device 300. This DC power is supplied to the battery 200 and various electric loads.

The engine 500 generates a rotational energy by combustion of fuel. This rotational energy is distributed to the first MG 401 and the second MG 402 via the power distribution mechanism 600. In this way, the power generation of the first MG 401 is implemented, and the propulsive force is applied to the traveling wheels.

The power distribution mechanism 600 includes a planetary gear mechanism. The power distribution mechanism 600 includes a sun gear, planetary gears, a planetary carrier, and a ring gear.

Each of the sun gear and the planetary gear is in a disk shape. A plurality of teeth is formed side by side in the circumferential direction on the circumferential surface of each of the sun gear and the planetary gear.

The planetary carriers are in a ring shape. A plurality of planetary gears is connected to a flat surface of the planetary carrier in such a manner that the flat surface of the planetary carrier and the planetary gears face each other.

The plurality of planetary gears is located on a circumference centered on a center of rotation of the planetary carrier. The planetary gears, which are adjacent to each other, are at a constant distance. In this embodiment, three planetary gears are arranged at 120° intervals.

The ring gear is in an annular shape. A plurality of teeth is formed side by side in the circumferential direction on each of an outer peripheral surface and an inner peripheral surface of the ring gear.

The sun gear is provided at the center of the ring gear. The outer peripheral surface of the sun gear and the inner peripheral surface of the ring gear face each other. Three planetary gears are provided between the sun gear and the ring gear. The teeth of each of the three planetary gears mesh with the teeth of the sun gear and the teeth of the ring gear. In this configuration, rotations of the sun gear, rotations of the planetary gear, rotations of the planetary carrier, and rotations of the ring gear can be transmitted to each other.

A motor shaft of the first MG401 is connected to the sun gear. The crankshaft of the engine 500 is connected to the planetary carrier. A motor shaft of the second MG 402 is connected to the ring gear. In this configuration, a rotation speed of the first MG 401, a rotation speed of the engine 500, and a rotation speed of the second MG 402 are in a linear relationship in a collinear diagram.

By supplying an AC power from the power conversion device 300 to the first MG 401 and the second MG 402, torque is generated in the sun gear and the ring gear. Torque is generated in the planetary carrier by combustion of the engine 500. In this configuration, power generation of the first MG 401, electric driving and regeneration of the second MG 402, and application of the propulsive force to the traveling wheels are performed.

For example, the MGECU, which is one of the above-mentioned plurality of ECUs, determines a target torque of the first MG 401 and a target torque of the second MG 402 based on physical quantities detected by using various sensors mounted on the hybrid vehicle, vehicle information input from another ECU, and the like. The MG ECU implements a vector-control, such that the torque generated in each of the first MG 401 and the second MG 402 becomes the target torque. This MGECU is mounted on a control circuit board 350 shown in FIG. 1.

<Circuit Configuration of Power Conversion Device>

Next, the power conversion device 300 will be described. As shown in FIG. 1, the power conversion device 300 includes a converter 310 and an inverter 320 as components of the power conversion circuit. The converter 310 functions to raise or lower a voltage level of DC power. The inverter 320 functions to convert a DC power into an AC power. The inverter 320 functions to convert an AC power into a DC power.

The converter 310 boosts the DC power of the battery 200 to a voltage level suitable for torque generation of the first MG 401 and the second MG 402. The inverter 320 converts the DC power into an AC power. This AC power is supplied to the first MG401 and the second MG402. Further, the inverter 320 converts the AC power generated by the first MG 401 and the second MG 402 into a DC power. The converter 310 steps down the DC power to a voltage level suitable for charging the battery 200.

As shown in FIG. 1, a wire harness 201 is connected to the battery 200. A positive electrode bus bar 301 is electrically connected to a positive electrode of the battery 200 via the wire harness 201. A negative electrode bus bar 302 is electrically connected to a negative electrode of the battery 200 via the wire harness 201. The wire harness 201 corresponds to a joint portion.

The converter 310 is electrically connected to the battery 200 via the positive electrode bus bar 301, the negative electrode bus bar 302, and the wire harness 201. Further, the converter 310 is electrically connected to the inverter 320 via a P bus bar 303 and an N bus bar 304.

<Converter>

The converter 310 includes, as electric elements, a filter capacitor 311, an A-phase switch module 312, and an A-phase reactor 313.

As shown in FIG. 1, a first electrode bus bar 315 is connected to one of two electrodes of the filter capacitor 311. A second electrode bus bar 316 is connected to the remaining one of the electrodes. The positive electrode bus bar 301 is connected to the first electrode bus bar 315. The negative electrode bus bar 302 is connected to the second electrode bus bar 316. In this configuration, the battery 200 and the filter capacitor 311 are electrically connected to each other.

One end of the A-phase reactor 313 is connected to the positive electrode bus bar 301. The other end of the A-phase reactor 313 is connected to the A-phase switch module 312 via a first connection bus bar 341. Further, the N bus bar 304 is connected to the second electrode bus bar 316. The A-phase switch module 312 is connected to the N bus bar 304. In this configuration, the battery 200 and the A-phase switch module 312 are electrically connected via the A-phase reactor 313. In FIG. 1, connection parts of the various bus bars are indicated by white circles. These connection parts are electrically connected by, for example, bolts or welding.

The A-phase switch module 312 includes a high-side switch 331 and a low-side switch 332. Further, the A-phase switch module 312 includes a high-side diode 331a and a low-side diode 332a. These semiconductor elements are embedded and protected by a sealing resin (not shown).

In this embodiment, an n-channel type IGBT is employed as each of the high-side switch 331 and the low-side switch 332. Tip ends of terminals, which are connected to the collector electrodes, the emitter electrodes, and the gate electrodes of the high-side switch 331 and the low-side switch 332, are exposed to the outside of the sealing resin.

As shown in FIG. 1, an emitter electrode of the high-side switch 331 and a collector electrode of the low-side switch 332 are connected to each other. In this configuration, the high-side switch 331 and the low-side switch 332 are connected in series.

Further, a cathode electrode of the high-side diode 331a is connected to a collector electrode of the high-side switch 331. An anode electrode of the high-side diode 331a is connected to an emitter electrode of the high-side switch 331. In this configuration, the high-side diode 331a is connected in anti-parallel to the high-side switch 331.

Similarly, a cathode electrode of the low-side diode 332a is connected to a collector electrode of the low-side switch 332. An anode electrode of the low-side diode 332a is connected to an emitter electrode of the low-side switch 332. In this configuration, the low-side diode 332a is connected in anti-parallel to the low-side switch 332.

As described above, the high-side switch 331 and the low-side switch 332 are covered and protected by the sealing resin. Tip ends of terminals, which are connected to the collector electrode and the gate electrode of the high-side switch 331, an intermediate point between the high-side switch 331 and the low-side switch 332, and the emitter electrode and the gate electrode of the low-side switch 332, are exposed from this sealing resin. In the following, these terminals are referred to as a collector terminal 330a, an intermediate point terminal 330c, an emitter terminal 330b, and a gate terminal 330d.

The collector terminal 330a is connected to the P bus bar 303. The emitter terminal 330b is connected to the N bus bar 304. In this configuration, the high-side switch 331 and the low-side switch 332 are sequentially connected in series from the P bus bar 303 to the N bus bar 304.

Further, the intermediate point terminal 330c is connected to the first connection bus bar 341. The first connection bus bar 341 is electrically connected to the positive electrode of the battery 200 via the A-phase reactor 313 and the positive electrode bus bar 301.

In the configuration described above, an DC power of the battery 200 is supplied to the intermediate point of the two switches included in the A-phase switch module 312 via the positive electrode bus bar 301, the A-phase reactor 313, and the first connection bus bar 341. An AC power of the motor 400, which is converted into a DC power by the inverter 320, is supplied to the collector electrode of the high-side switch 331 of the A-phase switch module 312.

A gate driver is connected to the gate terminal 330*d* of each of the high-side switch 331 and the low-side switch 332. The MGECU generates a control signal and outputs the control signal to the gate driver. The gate driver amplifies the control signal and outputs the control signal to the gate terminal 330*d*. In this configuration, the high-side switch 331 and the low-side switch 332 are controlled to open and close by the MGECU. In this way, the voltage level of the DC power input to the converter 310 is stepped up and down.

The MGECU generates a pulse signal as the control signal. The MGECU adjusts a step-up/down level of the DC power by adjusting an on-duty ratio and a frequency of the pulse signal. This step-up/down level is determined according to the target torque of the motor 400 and the SOC of the battery 200.

When boosting the DC power of the battery 200, the MGECU alternately opens and closes the high-side switch 331 and the low-side switch 332. On the contrary, when steeping down the DC power supplied from the inverter 320, the MGECU fixes the control signal output to the low-side switch 332 to a low level. At the same time, the MGECU sequentially switches the control signal output to the high-side switch 331 between a high level and a low level.

<Inverter>

The inverter 320 includes, as electric elements, a smoothing capacitor 321, a discharge resistor (not shown), and a U-phase switch module 324 to a Z-phase switch module 329.

A third electrode bus bar 322 is connected to one of the two electrodes of the smoothing capacitor 321. A fourth electrode bus bar 323 is connected to the remaining one of the electrodes. The P bus bar 303 is connected to the third electrode bus bar 322. Further, the N bus bar 304 is connected to the fourth electrode bus bar 323.

The discharge resistance is also connected to the P bus bar 303 and the N bus bar 304. The U-phase switch module 324 to the Z-phase switch module 329 are also connected to the P bus bar 303 and the N bus bar 304. The smoothing capacitor 321, the discharge resistor, and the U-phase switch module 324 to the Z-phase switch module 329 are connected in parallel between the P bus bar 303 and the N bus bar 304.

Each of the U-phase switch module 324 to the Z-phase switch module 329 includes components equivalent to those of the A-phase switch module 312. That is, each of the U-phase switch module 324 to the Z-phase switch module 329 includes the high-side switch 331, the low-side switch 332, the high-side diode 331*a*, the low-side diode 332*a*, and the sealing resin. Each of these 6-phase switch modules includes the collector terminal 330*a*, the emitter terminal 330*b*, the intermediate point terminal 330*c*, and the gate terminal 330*d*.

The collector terminal 330*a* of each of these 6-phase switch modules is connected to the P bus bar 303. The emitter terminal 330*b* is connected to the N bus bar 304.

The intermediate point terminal 330*c* of the U-phase switch module 324 is connected to a U-phase stator coil of the first MG 401 via a second connection bus bar 342. The intermediate point terminal 330*c* of a V-phase switch module 325 is connected to a V-phase stator coil of the first MG 401 via a third connection bus bar 343. The intermediate point terminal 330*c* of a W-phase switch module 326 is connected to a W-phase stator coil of the first MG 401 via a fourth connection bus bar 344.

Similarly, the intermediate point terminal 330*c* of an X-phase switch module 327 is connected to an X-phase stator coil of the second MG 402 via a fifth connection bus bar 345. The intermediate point terminal 330*c* of a Y-phase switch module 328 is connected to a Y-phase stator coil of the second MG 402 via a sixth connection bus bar 346. The intermediate point terminal 330*c* of the Z-phase switch module 329 is connected to the Z-phase stator coil of the second MG 402 via a seventh connection bus bar 347.

The gate terminal 330*d* of each of these 6-phase switch modules is connected to the above-described gate driver. When each of the first MG 401 and the second MG 402 is electrically driven, the high-side switches 331 and the low-side switches 332 included in the 6-phase switch module are PWM controlled by the output of the control signal from the MG ECU. In this way, three-phase alternating current is generated in the inverter 320. When each of the first MG 401 and the second MG 402 generates (regenerates), the MG ECU, for example, stops the output of the control signal. In this way, the AC power generated by the power generation passes through the diodes provided in the 6-phase switch module. As a result, the AC power is converted to DC power.

The type of the switch element provided in each of the A-phase switch module 312 and the U-phase switch module 324 to the Z-phase switch module 329 is not particularly limited, and MOSFETs may be employed, for example. The semiconductor elements such as the switches and the diodes included in these switch modules may be formed of a semiconductor such as Si and may be formed of a wide-gap semiconductor such as SiC. A material of the semiconductors element is not particularly limited.

Further, an example is shown in which each of the A-phase switch module 312 and the U-phase switch module 324 to the Z-phase switch module 329 includes the one high-side switch 331 and the one low-side switch 332. It is noted that, each of these switch modules may have a plurality of high-side switches 331 and a plurality of low-side switches 332. In such a configuration, the plurality of high-side switches 331 are connected in parallel between the P bus bar 303 and the low-side switch 332. The plurality of low-side switches 332 are connected in parallel between the high-side switch 331 and the N bus bar 304.

<Mechanical Configuration of Power Conversion Device>

Figure 2:
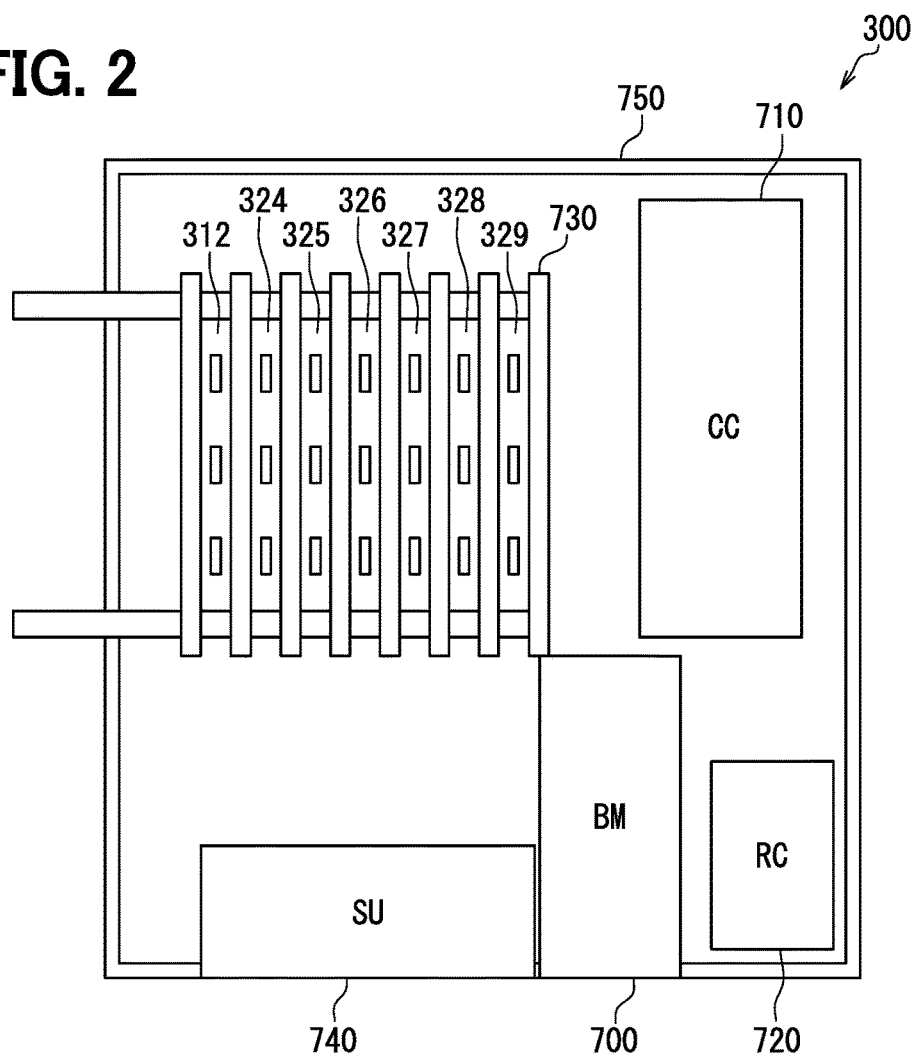
FIG. 2 is an explanatory schematic diagram showing a power conversion device.

The power conversion device 300 includes various components schematically shown in FIG. 2 in addition to the components of the power conversion circuit described above. The power conversion device 300 includes the bus bar module 700, a capacitor case 710, a reactor case 720, a cooler 730, a sensor unit 740, and a housing 750. In FIG. 2, the bus bar module 700 is referred to as BM, the capacitor case 710 is referred to as CC, the reactor case 720 is referred to as RC, and the sensor unit 740 is referred to as SU.

The bus bar module 700 includes the positive electrode bus bar 301 and the negative electrode bus bar 302 as described above. The bus bar module 700 will be described later in detail.

Each of the capacitor case 710 and the reactor case 720 is made of an insulative resin material. The filter capacitor 311 and the smoothing capacitor 321 are accommodated in the capacitor case 710. The A-phase reactor 313 is accommodated in the reactor case 720.

The cooler 730 accommodates the switch modules included in the converter 310 and the inverter 320. Refrigerant flows inside the cooler 730. The cooler 730 serves a function to cool the plurality of switch modules.

The sensor unit 740 includes a terminal block formed of an insulative resin material. The above-described first connection bus bar 341 to the seventh connection bus bar 347 are insert-molded in this terminal block. The terminal block is provided with a current sensor that detects a current flowing through the plurality of connection bus bars.

The housing 750 is formed by, for example, die casting aluminum. The housing 750 accommodates the bus bar module 700, the capacitor case 710, the reactor case 720, the cooler 730, and the sensor unit 740. These accommodated components are fixed to the housing 750 by a fixing member such as a bolt and a spring. Therefore, these accommodated components are configured to conduct heat to each other via the fixing member and the housing 750.

The housing 750 further accommodates various bus bars and the control circuit board 350 shown in FIG. 1. In order to avoid complicated notation, FIG. 2 omits illustration of the various bus bars and the control circuit board 350.

<Bus Bar Module>

Next, the bus bar module 700 included in the power conversion device 300 will be described. Three directions orthogonal to one another are referred to as an X-direction, a Y-direction, and a Z-direction. In the drawings, the "direction" is omitted and simply shown by x, y, and z.

Figure 3:
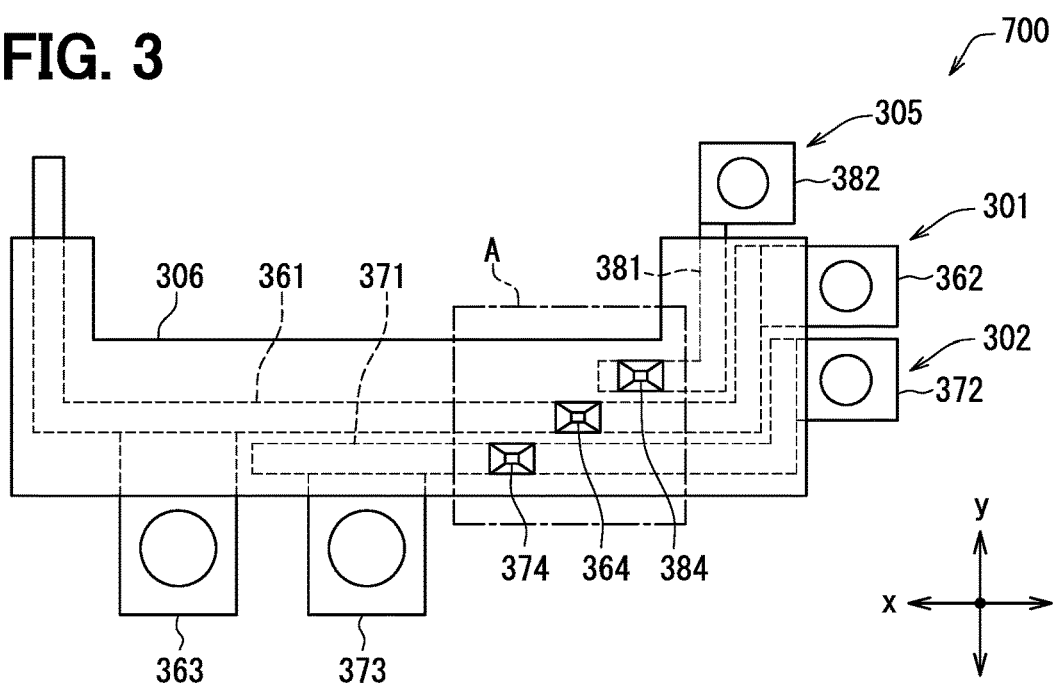
FIG. 3 is a top view showing a bus bar module.

As shown in FIG. 3, the bus bar module 700 includes the positive electrode bus bar 301 and the negative electrode bus bar 302. In addition to these two bus bars, the bus bar module 700 includes a voltage detection bus bar 305 and a resin case 306.

The bus bar module 700 corresponds to an electric conductive part for a power conversion circuit. The positive electrode bus bar 301 corresponds to a first connection conductive portion. The negative electrode bus bar 302 corresponds to a second connection conductive portion. The voltage detection bus bar 305 corresponds to a voltage detection conductive part.

As shown in FIG. 1, the voltage detection bus bar 305 is connected to the P bus bar 303. The voltage detection bus bar 305 serves as a function to detect the voltage on the side of the inverter 320. The resin case 306 serves as a function to integrally connect the positive electrode bus bar 301, the negative electrode bus bar 302, and the voltage detection bus bar 305 with each other while covering those components. These three bus bars are insert-molded in the resin case 306.

The positive electrode bus bar 301, the negative electrode bus bar 302, and the voltage detection bus bar 305 are formed of a metallic material such as copper or aluminum, which is higher in rigidity than the resin case 306. These three bus bars are manufactured by press forming of a flat metal plate. Therefore, each of these three bus bars has a bent portion. a portion of each of the three bus bars exposed from the resin case 306 forms a connection point with another component.

<Positive Electrode Bus Bar>

The positive electrode bus bar 301 includes, more in detail, a positive electrode path portion 361, a positive electrode capacitor connection portion 362, a positive electrode connection portion 363, and a positive electrode branch portion 364. These components are partially covered with the resin case 306. The positive electrode path portion 361, the positive electrode capacitor connection portion 362, and the positive electrode connection portion 363 correspond to a path portion of the first connection conductive portion. The positive electrode branch portion 364 corresponds to a branch portion of the first connection conductive portion.

The positive electrode path portion 361 has an upper surface and a lower surface, which are distant from each other in the z direction. A positive electrode capacitor connection portion 362 and the positive electrode connection portion 363 are integrally connected to the side of the lower surface of the positive electrode path portion 361. The positive electrode branch portion 364 is integrally connected to the side of the upper surface of the positive electrode path portion 361.

The positive electrode path portion 361 is in a substantially C shape in a plane perpendicular to the z direction. The positive electrode path portion 361 extends in the y direction, then is bent and extends in the x direction, and then is bent again and extends in the y direction. Therefore, two ends of the positive electrode path portion 361 extend in the y direction. These two ends are distant from each other and are arranged so as to face each other in the x direction. A center portion of the positive electrode path portion 361 extends in the x direction and bridges the two ends. Each of the two ends of the positive electrode path portion 361 is thin in the x direction. The center portion of the positive electrode path portion 361 is thin in the y direction.

The positive electrode capacitor connection portion 362 is integrally connected to one of the two end portions of the positive electrode path portion 361. The positive electrode capacitor connection portion 362 extends so as to be away from each of the two end portions of the positive electrode path portion 361 in the x direction. The positive electrode capacitor connection portion 362 is in a flat plate shape and is thin in the z direction.

The positive electrode capacitor connection portion 362 is partially exposed from the resin case 306. A through hole penetrating in the z direction is formed in a portion of the positive electrode capacitor connection portion 362 exposed from the resin case 306. A through hole formed in the first electrode bus bar 315 is arranged with the through hole along the z direction. A shaft portion of a bolt (not shown) is passed through these two through holes. Then, a nut is fastened to a tip end of the shaft portion of the bolt. The positive electrode capacitor connection portion 362 and the first electrode bus bar 315 are interposed between a head portion of the bolt and a nut. In this way, the positive electrode capacitor connection portion 362 and the first electrode bus bar 315 are connected with each other.

The positive electrode connection portion 363 is integrally connected to an intermediate portion of the positive electrode path portion 361. The positive electrode connection portion 363 extends so as to be away from a portion of the positive electrode path portion 361 in the y direction. The positive electrode connection portion 363 is in a flat plate shape and is thin in the z direction.

A portion of the positive electrode connection portion 363 is exposed from the resin case 306. A through hole penetrating in the z direction is formed in a portion of the positive electrode connection portion 363 exposed from the resin case 306. An opening of a metal terminal of the wire harness 201 is arranged with the through hole along the z-direction. A shaft portion of a bolt (not shown) is passed through the through hole and the opening. A nut is fastened to a tip end of the shaft portion of this bolt. The positive electrode connection portion 363 and the metal terminal are interposed between a head portion of the bolt and a nut. In this way, the positive electrode connection portion 363 and the wire harness 201 are electrically connected to each other.

The positive electrode branch portion 364 is integrally connected to an intermediate portion of the positive electrode path portion 361. The positive electrode branch portion 364 extends from the positive electrode path portion 361 so as to be away from the positive electrode path portion 361 in the z direction. The positive electrode branch portion 364 is in a columnar shape.

Figure 4:
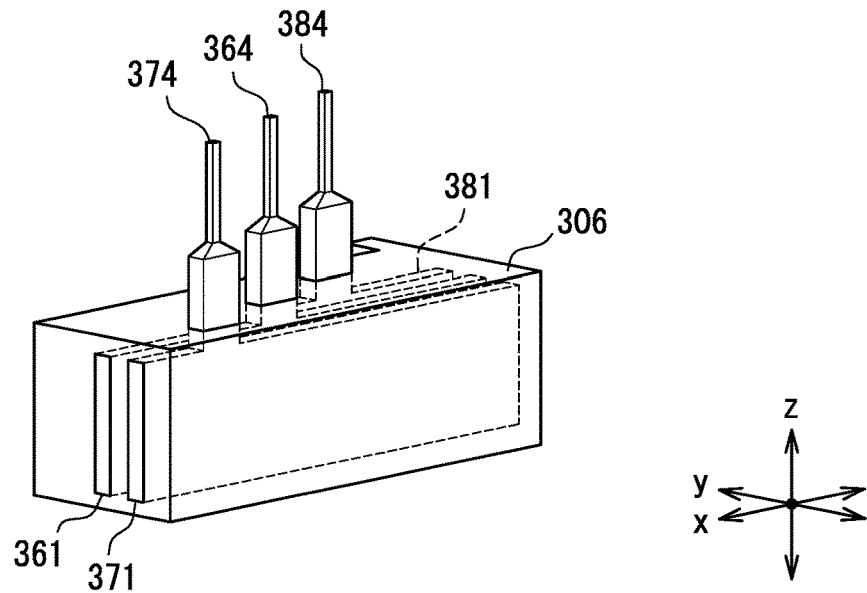
FIG. 4 is an enlarged perspective view of a region A surrounded by a dashed line shown in FIG. 3.
Figure 5:
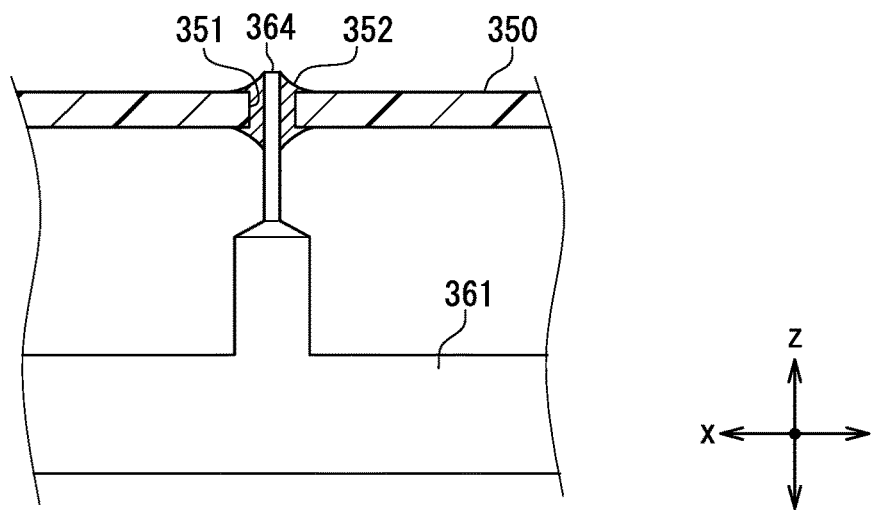
FIG. 5 is an explanatory cross-sectional view showing a connection state between a positive electrode bus bar and a control circuit board.

As shown in FIG. 4, the positive electrode branch portion 364 is partially exposed from the resin case 306. A tip end of the portion of the positive electrode branch portion 364 exposed from the resin case 306 is thinner than a root portion on the side of the resin case 306. As shown in FIG. 5, the tip end of the positive electrode branch portion 364 is passed through a through hole 351 formed in the control circuit board 350. Then, the positive electrode branch portion 364 and the control circuit board 350 are mechanically and electrically connected via a solder 352. In this configuration, the positive electrode bus bar 301 and the control circuit board 350 are electrically connected and are enabled to conduct heat. Note that FIG. 5 omits the illustration of the resin case 306.

One of two end portions of the positive electrode path portion 361 is exposed from the resin case 306. The A-phase reactor 313 is connected to this end portion. Welding, bolting, or the like may be adopted for this connection.

<Negative Electrode Bus Bar>

The negative electrode bus bar 302 includes, as its portions, a negative electrode path portion 371, a negative electrode capacitor connection portion 372, a negative electrode connection portion 373, and a negative electrode branch portion 374. At least a part of each of these portions is covered with the resin case 306. The negative electrode path portion 371, the negative electrode capacitor connection portion 372, and the negative electrode connection portion 373 correspond to a path portion of a second connection conductive portion. The negative electrode branch portion 374 corresponds to a branch portion of the second connection conductive portion.

The negative electrode path portion 371 has an upper surface and a lower surface, which are distant from each other in the z direction. The negative electrode capacitor connection portion 372 and the negative electrode connection portion 373 are integrally connected to the side of the lower surface of the negative electrode path portion 371. The negative electrode branch portion 374 is integrally connected to the side of the upper surface of the negative electrode path portion 371.

The negative electrode path portion 371 is in a substantially L shape in a plane perpendicular to the z direction. The negative electrode path portion 371 extends in the y direction and then is bent and extends in the x direction. A portion of the negative electrode path portion 371 extending in the y direction is thin in the x direction. A portion of the negative electrode path portion 371 extending in the x direction is thin in the y direction.

The negative electrode capacitor connection portion 372 is integrally connected to a portion of the negative electrode path portion 371 extending in the y direction. The negative electrode capacitor connection portion 372 extends from the negative electrode path portion 371 so as to be away from the negative electrode path portion 371 in the x direction. The negative electrode capacitor connection portion 372 is in a flat plate shape and is thin in the z direction.

The negative electrode capacitor connection portion 372 is partially exposed from the resin case 306. A through hole penetrating in the z direction is formed in a portion of the negative electrode capacitor connection portion 372 exposed from the resin case 306. A through hole formed in the second electrode bus bar 316 is arranged with the through hole along the z direction. A shaft portion of a bolt is passed through these two through holes. A nut is fastened to the shaft portion of this bolt. The negative electrode capacitor connection portion 372 and the second electrode bus bar 316 are interposed between a head portion of the bolt and a nut.

In this way, the negative electrode capacitor connection portion 372 and the second electrode bus bar 316 are connected with each other.

The negative electrode connection portion 373 is integrally connected to a portion of the negative electrode path portion 371 extending in the x direction. The negative electrode connection portion 373 extends from the negative electrode path portion 371 so as to be away from the negative electrode path portion 371 in the y direction. The negative electrode connection portion 373 is in a flat plate shape and is thin in the z direction.

A portion of the negative electrode connection portion 373 is exposed from the resin case 306. A through hole penetrating in the z direction is formed in a portion of the negative electrode connection portion 373 exposed from the resin case 306. The opening of the metal terminal of the wire harness 201 is arranged with the through hole along the z direction. A shaft portion of a bolt is passed through the through hole and the opening. A nut is fastened to the shaft portion of this bolt. The negative electrode connection portion 373 and the metal terminal are interposed between a head portion of the bolt and a nut. In this way, the negative electrode connection portion 373 and the wire harness 201 are electrically connected to each other.

The negative electrode branch portion 374 is integrally connected to a portion of the negative electrode path portion 371 extending in the x direction. The negative electrode branch portion 374 extends from the negative electrode path portion 371 so as to be away from the negative electrode path portion 371 in the z direction. The negative electrode branch portion 374 is in a columnar shape.

As shown in FIG. 4, the negative electrode branch portion 374 is partially exposed from the resin case 306. A tip end of the portion of the negative electrode branch portion 374 exposed from the resin case 306 is thinner than a root portion on the side of the resin case 306. The tip end of the negative electrode branch portion 374 is passed through the through hole 351 formed in the control circuit board 350. Then, the negative electrode branch portion 374 and the control circuit board 350 are mechanically and electrically connected via the solder 352. In this configuration, the negative electrode bus bar 302 and the control circuit board 350 are electrically connected and are enabled to conduct heat.

<Voltage Detection Bus Bar>

The voltage detection bus bar 305 includes, as its portions, a voltage path portion 381, a bus bar connection portion 382, and a voltage branch portion 384. The voltage path portion 381 and the voltage branch portion 384 are partially covered with the resin case 306.

The voltage path portion 381 has an upper surface and a lower surface, which are distant from each other in the z direction. The bus bar connection portion 382 is integrally connected to the side of the lower surface of the voltage path portion 381. The voltage branch portion 384 is integrally connected to the side of the upper surface of the voltage path portion 381.

The voltage path portion 381 is in a substantially L shape in a plane perpendicular to the z direction. The voltage path portion 381 extends in the y direction and then is bent and extends in the x direction. A portion of the voltage path portion 381 extending in the y direction is thin in the x direction. A portion of the voltage path portion 381 extending in the x direction is thin in the y direction.

The bus bar connection portion 382 is integrally connected to a portion of the voltage path portion 381 extending in the y direction. The bus bar connection portion 382 extends from the voltage path portion 381 so as to be away from the voltage path portion 381 in the y direction. The bus bar connection portion 382 is in a flat plate shape and is thin in the z direction.

The bus bar connection portion 382 is exposed from the resin case 306. A through hole penetrating in the z direction is formed in the bus bar connection portion 382. A through hole formed in the P bus bar 303 is arranged with the through hole along the z direction. A shaft portion of a bolt is passed through these through holes. The bus bar connection portion 382 and the P bus bar 303 are interposed between a head portion of the bolt and a nut. In this way, the bus bar connection portion 382 and the P bus bar 303 are connected to each other.

The voltage branch portion 384 is connected to a portion of the voltage path portion 381 extending in the x direction. The voltage branch portion 384 extends from the voltage path portion 381 so as to be away from the voltage path portion 381 in the z direction. The voltage branch portion 384 is in a columnar shape.

As shown in FIG. 3, the voltage branch portion 384 is partially exposed from the resin case 306. A tip end of the portion of the voltage branch portion 384 exposed from the resin case 306 is thinner than a root portion on the side of the resin case 306. The tip end of the voltage branch portion 384 is passed through the through hole 351 formed in the control circuit board 350. Then, the voltage branch portion 384 and the control circuit board 350 are mechanically and electrically connected via the solder 352. In this configuration, the voltage detection bus bar 305 and the control circuit board 350 are electrically connected and are enabled to conduct heat.

<Resin Case>

As described above, the resin case 306 covers each of the positive electrode bus bar 301, the negative electrode bus bar 302, and the voltage detection bus bar 305. The resin case 306 corresponds to a case.

As shown in FIG. 3, the positive electrode bus bar 301, the negative electrode bus bar 302, and the voltage detection bus bar 305 are arranged in a direction orthogonal to a direction, in which these three bus bars extend, in a plane perpendicular to the z direction. In the resin case 306, the positive electrode bus bar 301 is located between the negative electrode bus bar 302 and the voltage detection bus bar 305. An intermediate portion of the positive electrode bus bar 301 is located between a portion of the voltage detection bus bar 305 extending in the x direction and a portion of the negative electrode bus bar 302 extending in the x direction. One of two ends of the positive electrode bus bar 301 is located between a portion of the voltage detection bus bar 305 extending in the y direction and a portion of the negative electrode bus bar 302 extending in the y direction.

Due to this positional relationship, the positive electrode capacitor connection portion 362 and the negative electrode capacitor connection portion 372 are arranged so as to be distant from each other in the y direction. The positive electrode connection portion 363 and the negative electrode connection portion 373 are arranged so as to be distant from each other in the x direction.

The positive electrode branch portion 364, the negative electrode branch portion 374, and the voltage branch portion 384 are arranged so as to be distant from each other in the x direction. The positive electrode branch portion 364 is located between the voltage branch portion 384 and the negative electrode branch portion 374 in the y direction. These three branch portions are not opposed to each other in the y direction and the x direction.

A metal collar (not shown) is insert-molded in the resin case 306. The collar is in an annular shape and opens in the z direction. Therefore, the collar has a through hole penetrating in the z direction in the same manner as the through hole formed in each of the above-described three bus bars.

A bolt is passed through the collar. A tip end of a shaft portion of this bolt is fastened to the housing 750. In this way, the bus bar module 700 is fixed to the housing 750. The resin case 306 is in contact with the above-described cooler 730.

In a state where the resin case 306 is fixed to the housing 750 in this way, the branch portion of each of the three bus bars, which is covered with the resin case 306, extends in the z direction so as to be away from a portion of the housing 750 to which the resin case 306 is fixed.

It should be noted that, instead of the above three bus bars being insert-molded in the resin case 306, it is also possible to adopt a configuration in which the three bus bars are fitted in the resin case 306. The fixation of the resin case 306 and the three bus bars is not particularly limited to the insert molding.

Issue

As described above, the positive electrode capacitor connection portion 362 of the positive electrode bus bar 301 is connected to the first electrode bus bar 315 of the filter capacitor 311. The positive electrode connection portion 363 is connected to the wire harness 201 of the battery 200. In addition, the negative electrode capacitor connection portion 372 of the negative electrode bus bar 302 is connected to the second electrode bus bar 316 of the filter capacitor 311. The negative electrode connection portion 373 is connected to the wire harness 201. Therefore, a temperature of the positive electrode bus bar 301 and the negative electrode bus bar 302 is likely to rise due to energization between the battery 200 and the filter capacitor 311.

Further, the positive electrode path portion 361 of the positive electrode bus bar 301 is connected to the A-phase reactor 313. The second electrode bus bar 316 connected to the negative electrode bus bar 302 is connected to the N bus bar 304. Therefore, a current of the converter 310 flows through the positive electrode bus bar 301 and the negative electrode bus bar 302. As a result, a temperature of the positive electrode bus bar 301 and the negative electrode bus bar 302 is likely to rise.

Therefore, a temperature of the filter capacitor 311 connected to the positive electrode bus bar 301 and the negative electrode bus bar 302 is also likely to rise. There is a risk that a temperature of the filter capacitor 311 may rise to a temperature close to its own heat resistant temperature. A temperature characteristic of the filter capacitor 311 may change due to the rise in temperature.

Operation and Effects

With respect to this issue, the positive electrode branch portion 364 is integrally connected to the positive electrode path portion 361. The positive electrode branch portion 364 extends from the positive electrode path portion 361 toward the control circuit board 350 and is connected to the control circuit board 350 via the solder 352. Similarly, the negative electrode branch portion 374 is integrally connected to the negative electrode path portion 371. The negative electrode branch portion 374 extends from the negative electrode path portion 371 toward the control circuit board 350 and is connected to the control circuit board 350 via the solder 352.

According to this configuration, the heat generated in each of the positive electrode path portion 361 and the negative electrode path portion 371 by energization is thermally conducted to the control circuit board 350 via the positive electrode branch portion 364 and the negative electrode branch portion 374. The heat generated by energization is transferred to the air in contact with these branch portions. In this way, the rise in temperature of the positive electrode path portion 361 and the negative electrode path portion 371 is suppressed. The rise in temperature of the filter capacitor 311 connected to the capacitor connection portion of these path portions is suppressed. The rise in temperature of the filter capacitor 311 to a temperature close to its heat resistant temperature is suppressed. Change in the electric characteristic of the capacitor due to the rise in temperature is suppressed.

The resin case 306, which accommodates the positive electrode bus bar 301 and the negative electrode bus bar 302, is fixed to the housing 750 via the bolt. Therefore, the heat generated by the bus bar accommodated in the resin case 306 is thermally conducted to the housing 750 via the resin case 306 and the bolt. In this way, the rise in temperature of the positive electrode bus bar 301, the negative electrode bus bar 302, and the filter capacitor 311, which is connected to them, is suppressed. Change in the electric characteristic of the capacitor is suppressed.

The cooler 730 is fixed to the housing 750. Therefore, the housing 750 is easily cooled by the cooler 730. The heat of the bus bar module 700 fixed to the housing 750 is easily conducted to the housing 750. In this configuration, the rise in temperature of the filter capacitor 311 connected to the positive electrode bus bar 301 and the negative electrode bus bar 302 of the bus bar module 700 can be easily suppressed.

In this embodiment, the resin case 306 is in contact with the cooler 730. Therefore, the heat of the bus bar module 700 is thermally conducted to the cooler 730. In this way, the rise in temperature of the filter capacitor 311 connected to the positive electrode bus bar 301 and the negative electrode bus bar 302 of the bus bar module 700 is effectively suppressed.

In addition to the positive electrode bus bar 301 and the negative electrode bus bar 302, the resin case 306 accommodates the voltage detection bus bar 305. In this configuration, increase in the size of the bus bar module 700 is suppressed as compared with a configuration in which the voltage detection bus bar 305 is not accommodated in the resin case 306.

The positive electrode branch portion 364, the negative electrode branch portion 374, and the voltage branch portion 384 are not opposed to each other in the y direction. Further, these three branch portions are not opposed to each other in the x direction.

According to this configuration, delay in the heat radiation of a branch portion to surrounding air, which is caused by rise in temperature of surrounding air due to heat radiation of the other of these three branch portions, is suppressed.

The A-phase reactor 313 is connected to the positive electrode bus bar 301. Therefore, the energization path of the positive electrode bus bar 301 generally includes two paths. In this way, increase in the temperature rise of the positive electrode bus bar 301 is suppressed as compared with a configuration in which the main energization path of the positive electrode bus bar 301 includes one path. The rise in temperature of the filter capacitor 311 connected to the positive electrode bus bar 301 is suppressed.

The positive electrode path portion 361 extends in the y direction and then is bent and extends in the x direction. Then, the positive electrode path portion 361 is bent and extends in the y direction again. The positive electrode capacitor connection portion 362 is integrally connected to a portion of the positive electrode path portion 361 extending in the y direction. The first electrode bus bar 315 is connected to the positive electrode capacitor connection portion 362. The positive electrode branch portion 364 is integrally connected to a portion of the positive electrode path portion 361 extending in the x direction. The control circuit board 350 is connected to the positive electrode branch portion 364. The A-phase reactor 313 is connected to a portion of the positive electrode path portion 361 extending in they direction again.

According to this configuration, vibration is transmitted from the first electrode bus bar 315 to the positive electrode capacitor connection portion 362. Then, this vibration is likely to be transmitted to the positive electrode branch portion 364 via the positive electrode path portion 361. However, the transmission of this vibration to the positive electrode branch portion 364 is suppressed by the bending portion of the positive electrode path portion 361. Further, vibration is transmitted from the A-phase reactor 313 to the positive electrode path portion 361. This vibration is likely to be transmitted to the positive electrode branch portion 364 via the positive electrode path portion 361. However, the transmission of this vibration to the positive electrode branch portion 364 is suppressed by the bending portion of the positive electrode path portion 361.

According to this configuration, it is possible to suppress generation of stress due to vibration at the connection portion between the positive electrode branch portion 364 and the control circuit board 350. It is possible to suppress occurrence of connection failure between the positive electrode bus bar 301 and the control circuit board 350.

The positive electrode connection portion 363 is integrally connected to a portion of the positive electrode path portion 361 extending in the x direction. The wire harness 201 is connected to the positive electrode connection portion 363. Therefore, vibration is transmitted from the wire harness 201 to the positive electrode connection portion 363. This vibration is likely to be transmitted to the positive electrode capacitor connection portion 362 via the positive electrode path portion 361. However, the transmission of this vibration to the positive electrode capacitor connection portion 362 is suppressed by the bending portion of the positive electrode path portion 361. According to this configuration, it is possible to suppress stress due to vibration at the connection portion between the positive electrode capacitor connection portion 362 and the first electrode bus bar 315. It is possible to suppress occurrence of connection failure between the positive electrode bus bar 301 and the filter capacitor 311.

The negative electrode path portion 371 extends in the y direction and then is bent and extends in the x direction. The negative electrode capacitor connection portion 372 is integrally connected to a portion of the negative electrode path portion 371 extending in the y direction. The second electrode bus bar 316 is connected to the negative electrode capacitor connection portion 372. The negative electrode branch portion 374 is integrally connected to a portion of the negative electrode path portion 371 extending in the x direction. The control circuit board 350 is connected to the negative electrode branch portion 374.

According to this configuration, vibration is transmitted from the second electrode bus bar 316 to the negative electrode capacitor connection portion 372. Then, this vibration is likely to be transmitted to the negative electrode branch portion 374 via the negative electrode path portion 371. However, the transmission of this vibration to the negative electrode branch portion 374 is suppressed by the bending portion of the negative electrode path portion 371. Therefore, it is possible to suppress stress at the connection portion between the negative electrode branch portion 374 and the control circuit board 350. It is possible to suppress occurrence of connection failure between the negative electrode bus bar 302 and the control circuit board 350.

The negative electrode connection portion 373 is integrally connected to a portion of the negative electrode path portion 371 extending in the x direction. The wire harness 201 is connected to the negative electrode connection portion 373. Therefore, vibration is transmitted from the wire harness 201 to the negative electrode connection portion 373. This vibration is likely to be transmitted to the negative electrode capacitor connection portion 372 via the negative electrode path portion 371. However, the transmission of this vibration to the negative capacitor connection portion 372 is suppressed by the bending portion of the negative electrode path portion 371. According to this configuration, it is possible to suppress stress due to vibration at the connection portion between the negative electrode capacitor connection portion 372 and the second electrode bus bar 316. It is possible to suppress occurrence of connection failure between the negative electrode bus bar 302 and the filter capacitor 311.

The voltage path portion 381 extends in the y direction and then is bent and extends in the x direction. The bus bar connection portion 382 is integrally connected to the portion of the voltage path portion 381 extending in the y direction. The P bus bar 303 is connected to the bus bar connection portion 382. The voltage branch portion 384 is integrally connected to the portion extending in the x direction. The control circuit board 350 is connected to the voltage branch portion 384.

According to this configuration, vibration is transmitted from the P bus bar 303 to the bus bar connection portion 382. Then, this vibration is likely to be transmitted to the voltage branch portion 384 via the voltage path portion 381. However, the transmission of this vibration to the voltage branch portion 384 is suppressed by the bending portion of the voltage path portion 381. Therefore, it is possible to suppress stress at the connection portion between the voltage branch portion 384 and the control circuit board 350. It is possible to suppress occurrence of connection failure between the voltage detection bus bar 305 and the control circuit board 350.

First Modification

In this embodiment, an example is shown in which the positive electrode branch portion 364 is in the shape shown in FIGS. 4 and 5. That is, an example is shown in which an intermediate portion between the end portion of the positive electrode branch portion 364 on the side of the positive electrode path portion 361 and the tip end of the positive electrode branch portion 364 on the side of the control circuit board 350 gradually becomes thinner from the end portion toward the tip end.

However, the shape of the positive electrode branch portion 364 is not particularly limited to the above example. Hereinafter, modified examples of the positive electrode branch portion 364 will be described with reference to FIGS. 6 to 12. The shapes described in these modifications may be applied to the negative electrode branch portion 374 and the voltage branch portion 384.

Figure 6:
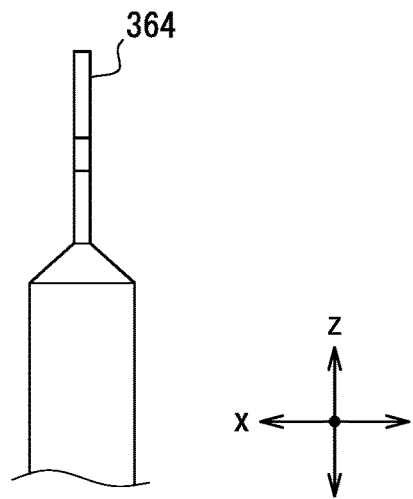
FIG. 6 is a front view showing a positive electrode branch portion according to a modified example.
Figure 7:
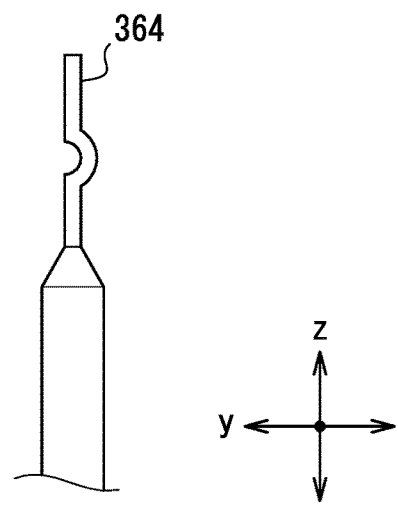
FIG. 7 is a side view showing the positive electrode branch portion according to the modified example.

For example, as shown in FIGS. 6 and 7, a configuration may be adopted in which the tip end of the positive electrode branch portion 364 partially is bent, and the positive electrode branch portion 364 has resiliency in its extending direction. According to this configuration, vibration can be absorbed at the bending portion of the positive electrode branch portion 364. Therefore, generation of stress in the solder 352 connecting the positive electrode branch portion 364 with the control circuit board 350 is suppressed.

Figure 8:
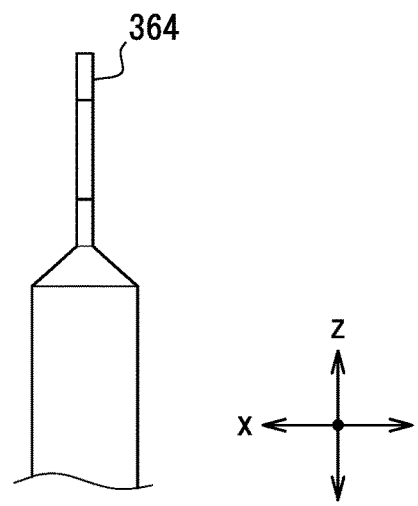
FIG. 8 is a front view showing a positive electrode branch portion according to a modified example.
Figure 9:
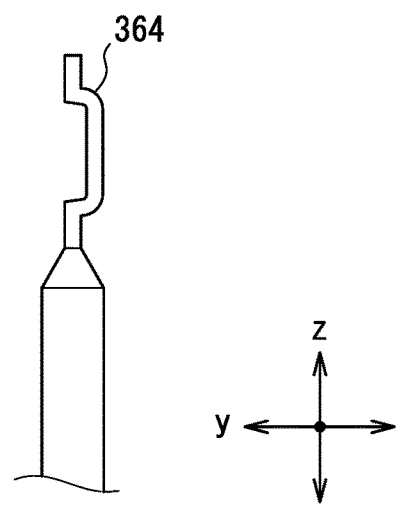
FIG. 9 is a side view showing the positive electrode branch portion according to the modified example.

As shown in FIGS. 8 and 9, it is also possible to adopt a configuration in which a bend is formed in a portion of the positive electrode branch portion 364 on the side of its tip end which is coated with the solder 352. According to this configuration, an anchor effect is caused to improve the connection strength between the positive electrode branch portion 364 and the control circuit board 350 via the solder 352.

Figure 10:
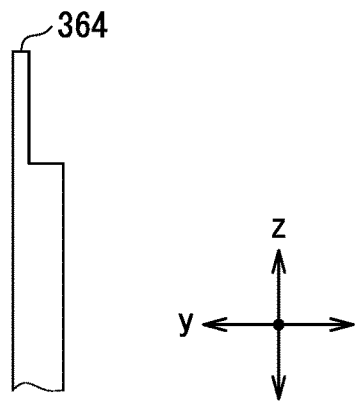
FIG. 10 is a side view showing the positive electrode branch portion according to a modified example.

As shown in FIG. 10, a local step portion may be formed in the positive electrode branch portion 364 at which the tip end of the positive electrode branch portion 364 is sharply thinned.

Figure 11:
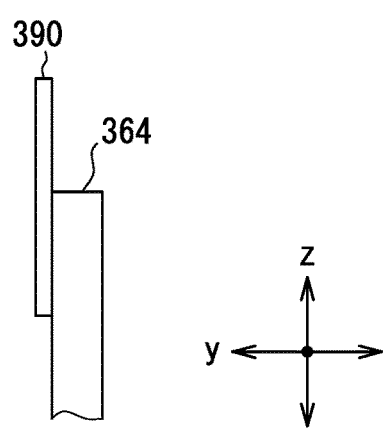
FIG. 11 is a side view showing the positive electrode branch portion according to a modified example.

As shown in FIG. 11, the thickness of the positive electrode branch portion 364 on the tip end side may be constant. Further, an extension portion 390 thinner than the positive electrode branch portion 364 may be connected to the tip end of the positive electrode branch portion 364 by welding or the like. In the case of this modification, the extension portion 390 is connected to the control circuit board 350 by the solder 352.

Figure 12:
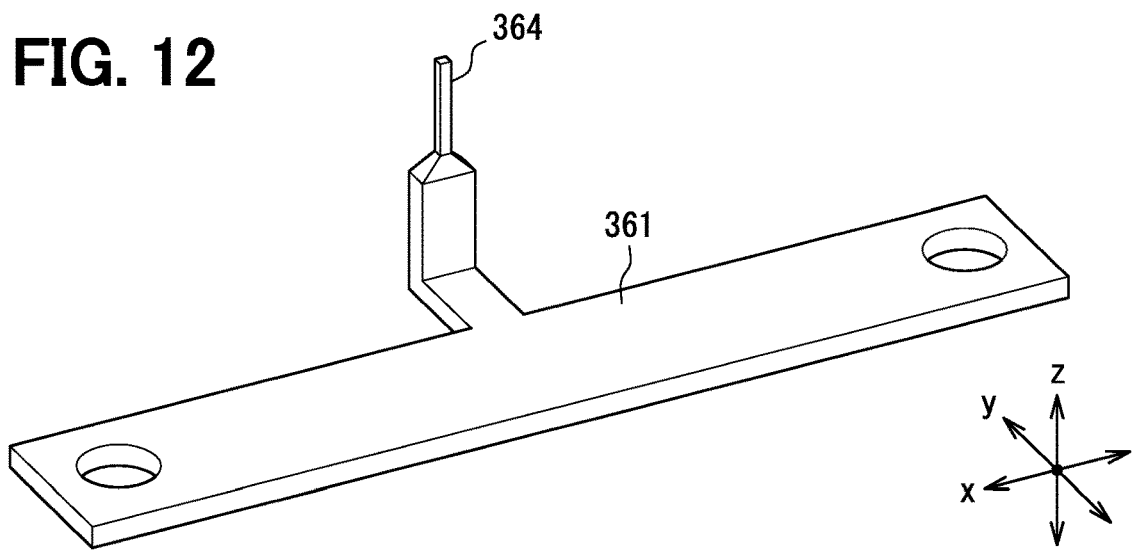
FIG. 12 is a perspective view showing a positive electrode bus bar according to a modified example.

As shown in FIG. 12, the positive electrode branch portion 364 may extend in the y direction and then bend and extend in the z direction so as to be away from the positive electrode path portion 361. According to this configuration, it is possible to suppress transmission of vibration of the positive electrode path portion 361 to the tip end of the positive electrode branch portion 364 by the bending portion of the positive electrode branch portion 364. Therefore, it is possible to suppress connection failure between the positive electrode branch portion 364 and the control circuit board 350.

Second Modification

In the embodiment, an example is shown in which the positive electrode path portion 361 is in the shape shown in FIGS. 3 and 4. That is, an example is shown in which the positive electrode path portion 361 is in a substantially C-shape in a plane perpendicular to the z direction.

However, the shape of the positive electrode path portion 361 is not limited to the above example. Hereinafter, modified examples of the positive electrode path portion 361 will be described with reference to FIGS. 12 to 14. The shapes described in these modifications may be applied to the negative electrode path portion 371 and the voltage path portion 381. In these drawings, illustration of the connection portion with the A-phase reactor 313 is omitted.

As shown in FIG. 12, the positive electrode path portion 361 may be in a flat plate shape being thin in thickness in the z direction. It is also possible to adopt a configuration in which a through hole for bolting the first electrode bus bar 315 is formed at one of two ends of the positive electrode path portion 361, and a through hole for bolting the metal terminal of the wire harness 201 is formed at the other end.

Figure 13:
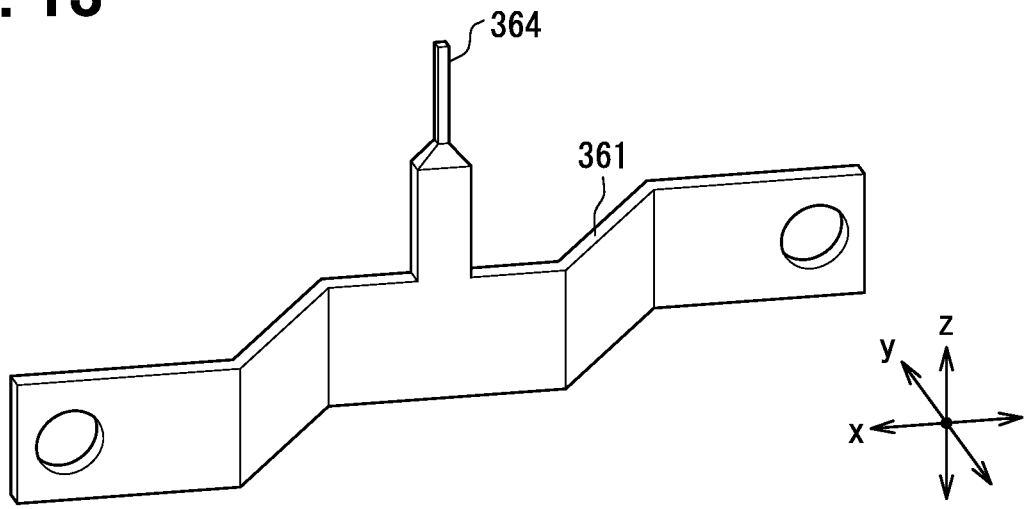
FIG. 13 is a perspective view showing a positive electrode bus bar according to a modified example.

As shown in FIG. 13, the positive electrode path portion 361 may be in a zigzag shape in a plane perpendicular to the z direction. It is also possible to adopt a configuration in which through holes for bolting the first electrode bus bar 315 and the wire harness 201 are formed at two ends, respectively, and the positive electrode path portion 361 is formed at an intermediate portion.

In the modification shown in FIG. 13, a portion is bent between a portion of the positive electrode path portion 361 where the through hole is formed and a portion where the positive electrode branch portion 364 is formed. In this configuration, transmission of vibration from the first electrode bus bar 315 and the wire harness 201 to the positive electrode branch portion 364 is suppressed by the bending portion of the voltage path portion 381.

Figure 14:
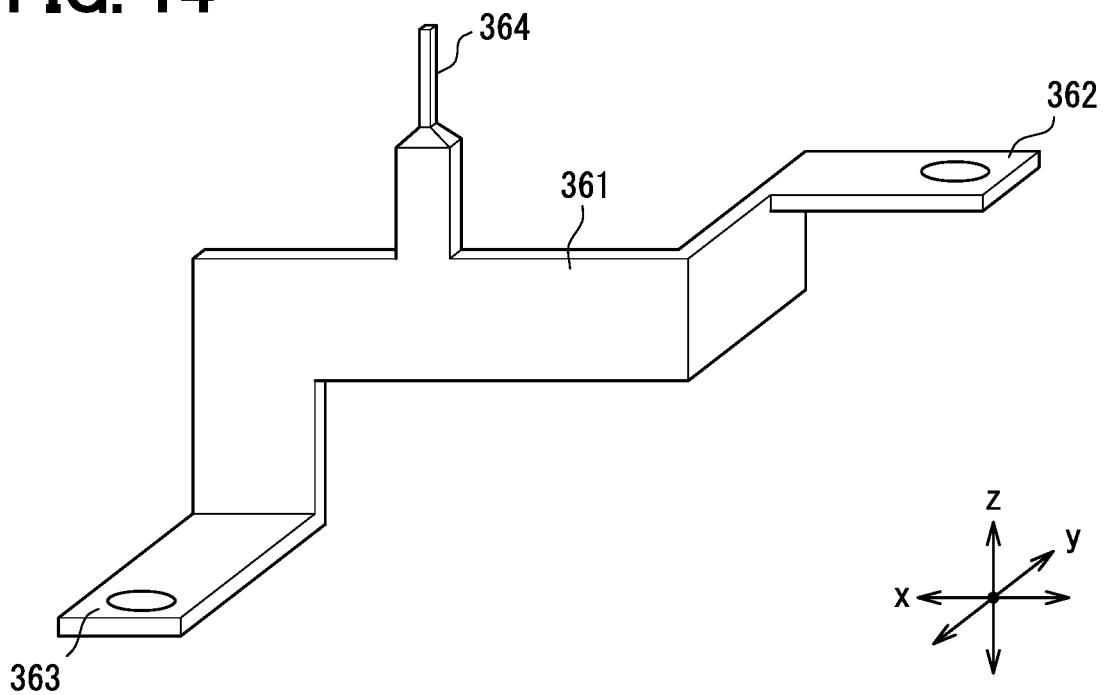
FIG. 14 is a perspective view showing a positive electrode bus bar according to a modified example.

In this embodiment, an example is shown in which the positive electrode capacitor connection portion 362 and the positive electrode connection portion 363 are integrally connected to the side of the lower surface of the positive electrode path portion 361. However, for example, as shown in FIG. 14, it is also possible to adopt a configuration in which the positive electrode connection portion 363 is integrally connected to the side of the lower surface of the positive electrode path portion 361, and the positive electrode capacitor connection portion 362 is integrally connected to the side of the upper surface. Further, as shown in FIG. 14, it is also possible to adopt a shape in which the connection portion of the positive electrode path portion 361 with the positive electrode connection portion 363 locally extends in the z direction. The positive electrode capacitor connection portion 362 may be integrally connected to the side of the lower surface of the positive electrode path portion 361, and the positive electrode connection portion 363 may be integrally connected to the side of the upper surface.

Third Modification

Figure 15:
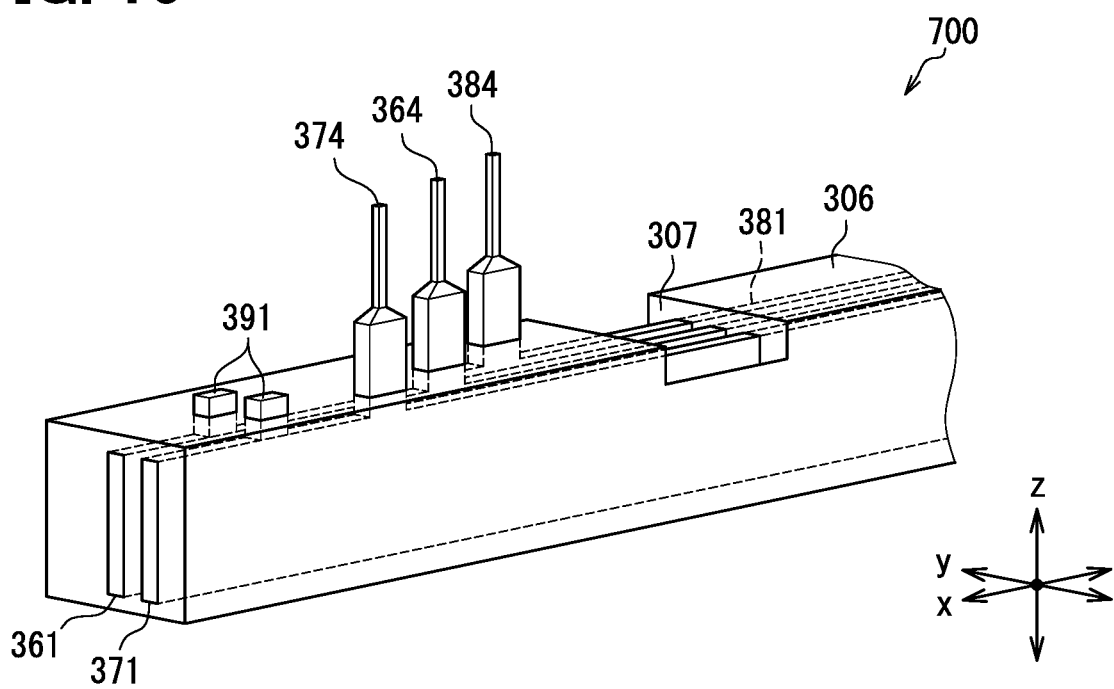
FIG. 15 is a perspective view showing a bus bar module according to a modified example.

As shown in FIG. 15, it is also possible to adopt a configuration in which a protrusion 391 locally protruding from the resin case 306 is formed in the positive electrode path portion 361 and the negative electrode path portion 371. A notch 307, at which the positive electrode path portion 361, the negative electrode path portion 371, and the voltage path portion 381 are partially exposed, may be formed in the resin case 306. The surface area of the bus bar module 700 is increased by the protrusion 391 and the notch 307. This configuration improves a heat dissipation performance of the bus bar module 700.

Other Modification

In the embodiment, an example is shown in which the power conversion device 300 including the bus bar module 700 is applied to the in-vehicle system 100 constituting the hybrid system. However, the application of the power conversion device 300 is not particularly limited to the above example. For example, it is possible to adopt a configuration in which the power conversion device 300 is applied to an in-vehicle system of an electric vehicle.

In the embodiment, an example is shown in which the inverter 320 includes the six modules including the U-phase switch modules 324 to the Z-phase switch module 329. However, it is also possible to adopt a configuration in which the inverter 320 includes three modules including the U-phase switch modules 324 to the W-phase switch module 326.

In the embodiment, an example is shown in which the power conversion device 300 includes the converter 310 and the inverter 320. However, the power conversion device 300 may include only the inverter 320. In this configuration, the positive electrode bus bar 301 is connected to the P bus bar 303. The negative electrode bus bar 302 is connected to the N bus bar 304. The positive electrode bus bar 301 and the negative electrode bus bar 302 serve to connect the battery 200 with the smoothing capacitor 321.

In this modification, as described in the embodiment, the rise in temperature of each of the P bus bar 303 and the N bus bar 304 is suppressed, so that the rise in temperature of the smoothing capacitor 321 connected to the P bus bar 303 and the N bus bar 304 is suppressed. The rise in temperature of the smoothing capacitor 321 to a temperature close to its heat resistant temperature is suppressed. Change in an electric characteristic of the smoothing capacitor 321 due to the temperature rise is suppressed.

Although the present disclosure has been described in accordance with the examples, it is understood that the present disclosure is not limited to such examples or structures. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. An electric conductive part for a power conversion circuit, the electric conductive part comprising:
a plurality of connection conductive portions including a first connection conductive portion and a second connection conductive portion configured to connect a joint portion of a battery with a capacitor that is included in the power conversion circuit, wherein
each of the first connection conductive portion and the second connection conductive portion includes
a path portion configured to connect the joint portion with the capacitor and
a branch portion that branches from the path portion,
the branch portion extends toward a control circuit board and is connected with the control circuit board,
the control circuit board is configured to control drive of a switch element of the power conversion circuit,
the first connection conductive portion is configured to be electrically connected to a positive electrode of the battery,
the second connection conductive portion is configured to be electrically connected to a negative electrode of the battery,
the path portion of the first connection conductive portion and the path portion of the second connection conductive portion are arranged in an orthogonal direction, which is orthogonal to an extension direction in which the path portion of the first connection conductive portion and the path portion of the second connection conductive portion extend, and
adjacent two of the branch portions are not opposed to each other in the orthogonal direction.

2. The electric conductive part according to claim 1, further comprising:
a case that accommodates the connection conductive portion, wherein
the case is configured to be fixed to a housing that accommodates the capacitor.

3. The electric conductive part according to claim 2, wherein
the case is configured to be in contact with a cooler that is configured to cool a plurality of switching elements including the switching element.

4. The electric conductive part according to claim 2, further comprising:
a voltage detection conductive portion for detection of a voltage of the power conversion circuit, wherein
the voltage detection conductive portion is accommodated in the case and connected to the control circuit board.

5. The electric conductive part according to claim 1, wherein
the path portion of the first connection conductive portion is configured to be connected with a reactor of the power conversion circuit.

6. The electric conductive part according to claim 1, wherein
the branch portion extends from the path portion toward the control circuit board, and
the branch portion is partially bent and is resilient in an extending direction in which the branch portion extends.

7. The electric conductive part according to claim 1, wherein
a tip end of the branch portion is connected with an extension portion, which is thinner than the branch portion in a direction, which is orthogonal to an extension direction in which the branch portion extends, and
the extension portion is connected to the control circuit board.

8. The electric conductive part according to claim 1, wherein
the path portion extends from the joint portion toward the capacitor and is partially bent.

9. The electric conductive part according to claim 8, wherein
the path portion is bent at a portion between a portion of the path portion, at which the path portion is configured to be connected with the joint portion, and a portion of the path portion, in which the branch portion is formed.

10. An electric conductive part for a power conversion circuit, the electric conductive part comprising:
a plurality of connection conductive portions including a first connection conductive portion, a second connection conductive portion, and a third connection conductive portion, wherein
the first connection conductive portion and the second connection conductive portion are configured to connect a joint portion of a battery with a capacitor that is included in the power conversion circuit,
each of the first connection conductive portion and the second connection conductive portion includes
a path portion configured to connect the joint portion with the capacitor and
a branch portion that branches from the path portion and extends toward a control circuit board and is connected with the control circuit board,
the third connection conductive portion includes
a path portion and
a branch portion that branches from the path portion and extends toward the control circuit board and is connected with the control circuit board,
the control circuit board is configured to control drive of a switch element of the power conversion circuit,
the first connection conductive portion is configured to be electrically connected to a positive electrode of the battery,
the second connection conductive portion is configured to be electrically connected to a negative electrode of the battery,
the path portion of the first connection conductive portion and the path portion of the second connection conductive portion are arranged in an orthogonal direction, which is orthogonal to an extension direction in which the path portion of the first connection conductive portion and the path portion of the second connection conductive portion extend, and
adjacent two of the branch portion of the first connection conductive portion, the branch portion of the second connection conductive portion, and the branch portion of the third connection conductive portion, are not opposed to each other in the orthogonal direction.

* * * * *